United States Patent [19]

Arakawa

[11] Patent Number: 4,677,590
[45] Date of Patent: Jun. 30, 1987

[54] NONVOLATILE SEMICONDUCTOR MEMORY CIRCUIT INCLUDING DUMMY SENSE AMPLIFIERS

[75] Inventor: Hideki Arakawa, Yokohama, Japan
[73] Assignee: Fujitsu Limited, Kawasaki, Japan
[21] Appl. No.: 844,257
[22] Filed: Mar. 24, 1986

Related U.S. Application Data

[63] Continuation of Ser. No. 454,253, Dec. 29, 1982, abandoned.

[30] Foreign Application Priority Data

Dec. 29, 1981 [JP] Japan .................................. 56-213401
Dec. 29, 1981 [JP] Japan .................................. 56-211398

[51] Int. Cl.[4] ................................................ G11C 11/40
[52] U.S. Cl. ..................................... 365/185; 365/210; 323/313
[58] Field of Search ............... 365/185, 184, 189, 210, 365/104; 357/23.5; 307/296 R, 297; 323/311, 312, 313, 314

[56] References Cited

U.S. PATENT DOCUMENTS

| | | | |
|---|---|---|---|
| 4,063,224 | 12/1977 | Kirschner | 365/184 |
| 4,099,264 | 7/1978 | Lodi | 365/184 |
| 4,223,394 | 9/1980 | Pathak et al. | 365/189 |
| 4,266,283 | 5/1981 | Perlegos et al. | 365/104 |
| 4,301,535 | 11/1981 | McKenney et al. | 365/185 |
| 4,404,659 | 9/1983 | Kihara et al. | 365/189 |
| 4,527,256 | 7/1985 | Giebel | 365/189 |

FOREIGN PATENT DOCUMENTS

| | | | |
|---|---|---|---|
| 0137933 | 10/1979 | Japan | 365/185 |
| 0019795 | 2/1983 | Japan | 365/189 |
| 2049327 | 12/1980 | United Kingdom . | |

OTHER PUBLICATIONS

Hagiwara et al., "A 16K Bit Electrically Erasable PROM Using n—Channel Si—Gate MNOS Technology", IEEE Jour. of Solid State Circuits, vol. SC—15, No. 3, Jun. 1980, pp. 346-353.

Schanzer, "Read Voltage Supply for MNOS Memory Arrays", RCA Technical Notes, No. 1233, Oct. 26, 1979, pp. 1-4.

Kelley et al., "An Electrically Alterable ROM—and It Doesn't Use Nitride", Electronics, vol. 49, No. 25, Dec. 9, 1976, pp. 101-104.

Primary Examiner—James W. Moffitt
Assistant Examiner—Glenn A. Gossage
Attorney, Agent, or Firm—Staas & Halsey

[57] ABSTRACT

A nonvolatile semiconductor memory circuit is provided with a plurality of bit lines and a plurality of word lines. The nonvolatile semiconductor memory cells are located at intersections of the bit lines and word lines and formed by MOS transistors having a floating gate and a control gate therein. A bias circuit supplies a read-out voltage to the control gate of the selected nonvolatile semiconductor memory cell. Sense amplifiers are also included, each having an input which receives read-out data from the selected nonvolatile semiconductor memory cell, and an output which outputs amplified read-out data.

A bias circuit is formed by a dummy cell having the same construction as the nonvolatile semiconductor memory cells. A dummy sense amplifier is included having the same construction as the sense amplifiers. A voltage setting circuit is also included, having feedback circuitry connected between the output of the voltage setting circuit and the control gate of the MOS transistor in the dummy cell. Further, in the present invention, depletion-type MOS transistors are used for coupling the gate of the MOS transistor to the bias circuit.

7 Claims, 7 Drawing Figures

NONVOLATILE SEMICONDUCTOR MEMORY CIRCUIT INCLUDING DUMMY SENSE AMPLIFIERS

This is a continuation of co-pending application Ser. No. 454,253 filed on Dec. 29, 1982 now abandoned.

BACKGROUND OF THE INVENTION

The present invention relates to a nonvolatile semiconductor memory circuit. More particularly, it relates to an electrically erasable programmable read-only memory (EEPROM) circuit.

Recently, nonvolatile semiconductor memory circuits which electrically write or erase information have frequently been used since in these circuits it is unnecessary to use an ultraviolet ray, etc., which is a drawback. The principle of writing or erasing data involves the so-called "tunnel effect" in a thin film formed between a floating gate and a drain in a metal-oxide semiconductor (MOS) transistor. Further, a control gate is provided along with the floating gate which is coupled, via condenser or a capacitive coupling, to the control gate. A writing mode, a read-out mode, and an erase mode are set by changing the voltage level supplied to the control gate, the drain, etc. In such a case, the threshold voltage level of the MOS transistor varies depending on the voltage supplied to the control gate and to the drain, that is, the erase voltage and the write voltage.

Theoretically, in the reading operation the level of the voltage supplied to the control gate may be fixed at a zero voltage level, that is, at a non-biased state. However, when memory circuits are mass produced, the control gate voltage is inconveniently fixed. It is inconveniently fixed because, in the production process, each wafer varies on the outside or the inside, thereby causing the thickness of the thin film formed between the floating gate and the drain to vary and the length or the width of the channel to vary. Further, the fact that the electric source voltage varies after the memory circuits are produced must be taken into the consideration. However, such variation is not considered conventionally. This is a main draw back in the conventional memory circuits.

Further, conventional memory circuits have the following drawbacks:

(1) Enhancement-type MOS transistors must be used as bit gate transistors and as word control gate selection transistors since a bias voltage generated in the bias circuit is supplied at a decreasing value to the control gate of the MOS transistor during an erase operation and results in an erase error.

(2) A rapid read-out speed can not be obtained since enhancement-type MOS transistors are used.

SUMMARY OF THE INVENTION

An object of the present invention is to provide a nonvolatile semiconductor memory circuit in which the drawbacks of conventional circuits are eliminated.

Another object of the present invention is to provide a nonvolatile semiconductor memory circuit which can supply a suitable and stable control gate voltage during readout to the memory cells regardless of a variation in the thickness and area of the thin film.

Still another object of the present invention is to provide a nonvolatile semiconductor memory circuit which can be operated during high speed at readout and which can be operated with a decreased amount of error during an erase operation.

The above-mentioned objects can be achieved by means of a nonvolatile semiconductor memory circuit provided with a plurality of bit lines and a plurality of word lines. Nonvolatile semiconductor memory cells are located at the intersections of the bit lines and word lines and formed by MOS transistors each having a floating gate and a control gate therein. A bias circuit supplies a readout voltage to the control gate of a selected nonvolatile semiconductor memory cell and sense amplifiers, each having an input which receives read-out data from the selected nonvolatile semiconductor memory cell and an output which outputs amplified read-out data. The bias circuit comprises a dummy cell having substantially the same construction as the nonvolatile semiconductor memory cell and a dummy sense amplifier which supplies a current to the dummy cell. The dummy cell outputs a voltage corresponding to the value of the current and has substantially the same construction as the sense amplifier. The bias circuit outputs the read-out voltage in proportion to the output of the dummy sense amplifier and supplies the read-out voltage to the control gate of the dummy cell.

Further, the above-mentioned objects can be achieved by means of a nonvolatile semiconductor memory circuit provided with a plurality of bit lines and a plurality of word lines. A group of nonvolatile semiconductor memory cells are located at the intersections of the word lines and the bit lines and formed by the MOS transistor having a floating gate and a control gate therein, a bias circuit which supplies a predetermined voltage to the control gate, and MOS transistors, formed by a depletion-type MOS transistor, located between the control gate and the bias circuit.

Further features and advantages of the present invention will be apparent from the ensuing description, made with reference to the accompanying drawings, to which, however, the scope of the invention is in no way limited.

DESCRIPTION OF THE PREFERRED EMBODIMENTS

Figure 1:
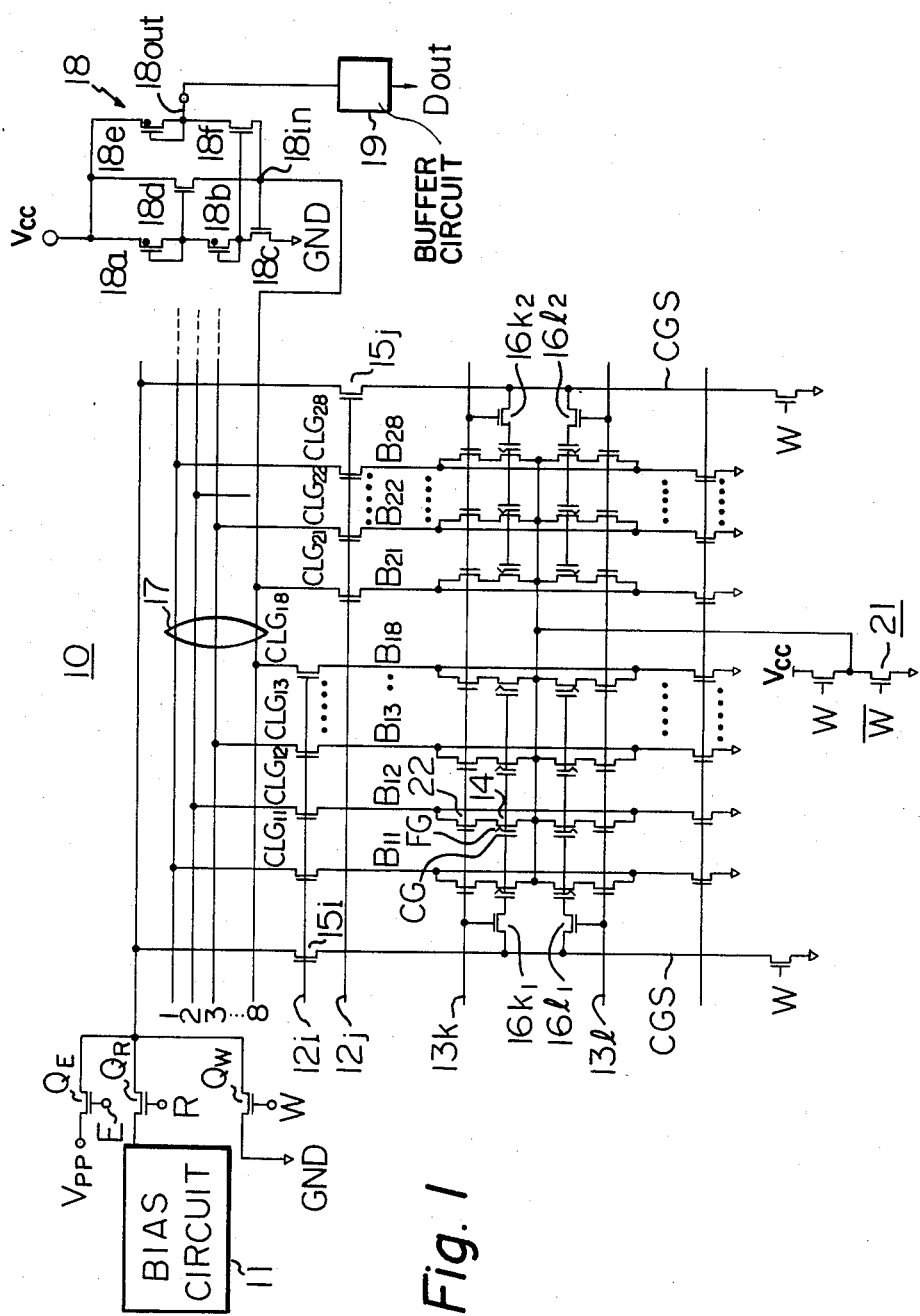
FIG. 1 is an embodiment of a nonvolatile semiconductor memory circuit which contains a bias circuit according to the present invention.

FIG. 1 is an embodiment of a nonvolatile semiconductor circuit which contains a bias circuit according to the present invention. The nonvolatile semiconductor circuit 10 includes a bias circuit 11 of the present invention, a plurality of column selection wires 12*i* and 12*j* (only two wires are shown), a plurality of row wires 13*k* and 13*l* (only two wires are shown), and a plurality of bit lines $B_{11}$, $B_{12}$, ... $B_{18}$, $B_{21}$, ..., $B_{28}$. Memory cells which are formed by a MOS transistor 14 and a transistor 22 for selecting the transistor 14 are arranged at intersections of the row wires 13$k$ and 13$l$ and the bit lines $B_{11}$, ... $B_{28}$. The selection transistor 22 is connected to the row wires 18$k$, 13$l$ and the bit lines $B_{11}$ and $B_{12}$, the MOS transistor 14 is connected in series to the selection transistor 22, and the source of the MOS transistor 14 is connected to a source potential determination circuit 21.

In FIG. 1, eight memory cells form one unit (1 byte), and the control gate of each unit is connected via column gate transistors 15$i$ and 15$j$, control gate selection column lines CGS, and row control gate selection transistors 16$k_1$, 16$k_2$ to the bias circuit 11.

$CLG_{11}$, ... $CLG_{18}$, $CLG_{21}$ ... $CLG_{28}$ are column selection transistors which connect the bit lines $B_{11}$ ... $B_{28}$ to an output bus 17. The output bus is provided with a sense amplifier 18 having an input 18 in and an output 18$_{out}$. Eight sense amplifiers 18 corresponding to each bit are provided (in FIG. 1, only one sense amplifier 18 is shown). The output data is read out of the sense amplifier 18 via a buffer circuit 19.

In FIG. 1, only one example of the sense amplifier 18 is shown. Of course, the sense amplifier is not limited to the circuit shown in FIG. 1, many other circuits can be used as the sense amplifier.

The sense amplifier 18 shown in FIG. 1 is composed of depletion-type transistors 18$a$, 18$b$, and 18$e$ and enhancement-type transistors 18$c$, 18$d$, and 18$f$. The input 18$_{in}$ is connected via the column selection transistors to the memory cell. When the memory cell is placed in the on state, the input 18$_{in}$ assumes a low potential, the transistor 18$c$ is turned off, the transistor 18$f$ is turned on, and a low level voltage is generated at the output 18$_{out}$. However, when the memory cell is placed in the off state, a high level is output at the output 18$_{out}$.

When information is written into the memory cell, the selection transistor 22 is placed in the on state and a write signal is supplied to a transistor $Q_W$, which is then placed in the on state. A ground potential GND is supplied via transistors 15 and 16 to the control gate CG of the selected eight-bit cell group. When information is to be erased, an erase signal is supplied to a transistor $Q_E$ and a voltage $V_{pp}$, for example, 20 volts, is supplied to the control gate CG of the selected cell group. When information is to be read out, a read signal R is supplied to a transistor $Q_R$, which is then placed in the on state (the transistors $Q_E$ and $Q_W$ are in the off state).

Figure 2A:
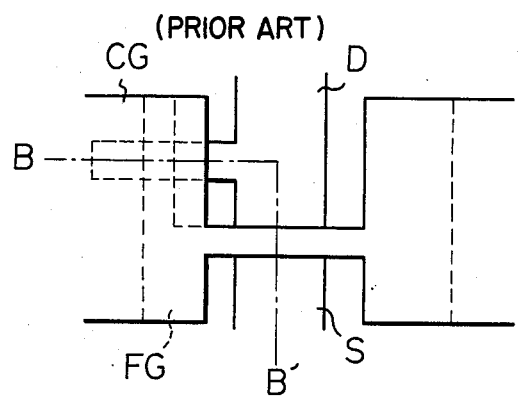
FIG. 2A is a plan view of a MOS transistor in a memory cell shown in FIG. 1.
Figure 2B:
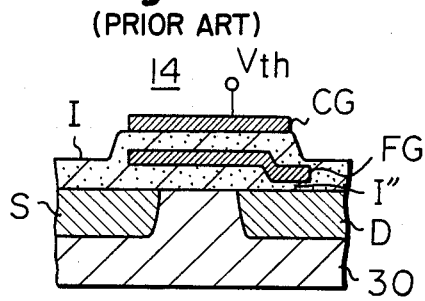
FIG. 2B is a cross-sectional view of the MOS transistor in the memory cell in FIG. 2A.
Figure 2C:
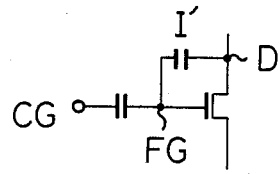
FIG. 2C is an equivalent circuit of the MOS transistor shown FIG. 2A.

FIG. 2A is a plan view of the MOS transistor 14 shown in FIG. 1, FIG. 2B shows a cross-sectional view along the line B-B' in FIG. 2A, and FIG. 2C is an equivalent circuit of the MOS transistor shown in FIG. 2A. In FIGS. 2A and 2B, CG and FG are, respectively, a control gate and a floating gate (previously explained). These gates are formed via an insulation film I on a channel sandwiched between a source and a drain in a semiconductor substrate 30. When information is erased, as previously mentioned, a high voltage $V_{pp}$ ($\simeq$20 V) is supplied to the control gate CG and drain D assumes the ground potential GND. Then a high potential is supplied to the floating gate FG by a capacitive coupling between the control gate CG and the floating gate FG and a high electric field is formed in a very thin insulation film I' located between the floating gate FG and the drain D, with the result that electrons are injected from the drain D into the floating gate FG due to the tunnel effect and thereby the erase operation is completed. When information is written into the memory cell, a high voltage is supplied to the drain D and the control gate CG is grounded so that the direction of the high electric field in the insulation film I' is inverted. Then the charges injected into the floating gate are extracted and data "0" is written. When the data to be written is "1", the electrons injected into the floating gate FG are not extracted. The above-mentioned technique is well-known in the art.

Figure 3:
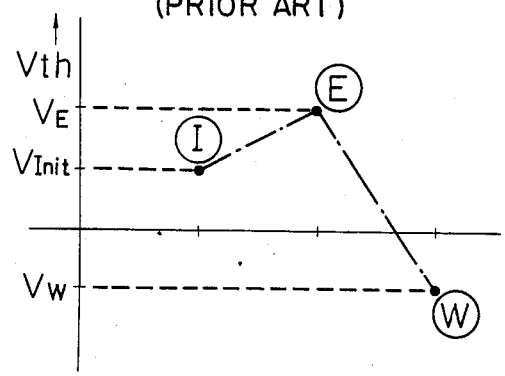
FIG. 3 is a diagram of the threshold voltage of the MOS transistor after erase and after write operations shown in FIGS. 2A and 2B.

The present invention is concerned with suitably supplying the bias voltage to the control gate CG during a read mode operation. FIG. 3 is a diagram showing the relationship between the erased information and the written information and the threshold voltage $V_{th}$ of the MOS transistor 14 (the control gate voltage). At readout, the bias voltage of the MOS transistor 14 must be between E and W, i.e., the control gate voltage of the MOS transistor 14 is I. More precisely, the threshold voltages $V_W$, $V_E$, and $V_{Init}$ are $V_W = -2 \sim 0$ V, $V_{Init} = 1 \sim 2$ V, and $V_E = 3 \sim 5$ V.

As is mentioned above, when information is read from the memory cell, the control gate bias voltage $V_R$ in the read-out state is set at $V_{Init}$. However, this threshold level $V_{Init}$ varies, as was previously mentioned, and can not always be maintained at a suitable value. That is, this value $V_{Init}$ shifts upward or downward, and this shifting is not preferable for carryng out a stable and exact read-out operation.

Figure 4:
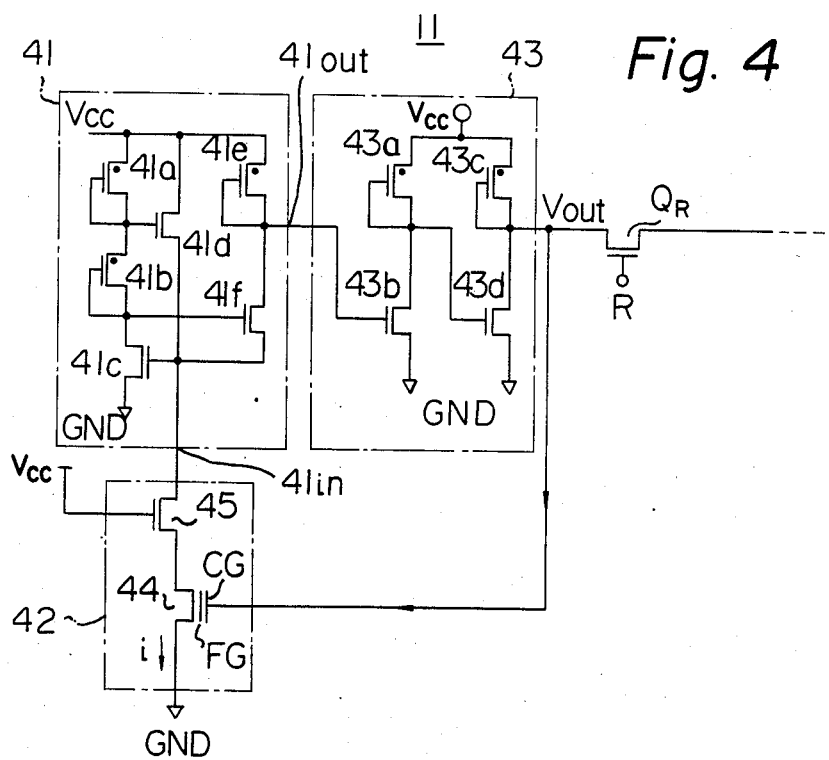
FIG. 4 is a circuit of one embodiment of a bias circuit according to the present invention.

FIG. 4 is a diagram of the bias circuit 11 according to the present invention. In FIG. 4, the bias circuit 11 comprises a dummy sense amplifier 41 (which has substantially the same construction as the sense amplifier 18), a dummy cell 42, and a voltage setting circuit 43.

The dummy sense amplifier 41 comprises depletion-type transistors 41$a$, 41$b$, and 41$e$ and enhancement-type transistors 41$c$, 41$d$, and 41$f$. The voltage setting circuit 43 comprises depletion-type transistors 43$a$ and 43$c$ and enhancement-type transistors 43$b$ and 43$d$. In the dummy cell 42, the first transistor 44 has the same construction as the transistor 14, i.e., it is provided with a floating gate FG and a control gate CG, and the second transistor 45 has the same construction as the selection transistor 22. The series-connected transistors 44 and 45 extract a predetermined current i from the input 41$_{in}$ of the dummy sense amplifier 41 and cause it to flow to ground (GND). The value of the current i is always a constant value since the output voltage $V_{out}$ of the voltage setting circuit 43 is partially branched and is fed back to the control gate CG of the transistor 44. That is, when the current i increases, the transistor 41C is turned off and the transistor 41$f$ is turned on, with the result that the output 41$_{out}$ of the dummy cell 42 decreases. Therefore, in the voltage setting circuit 43, the transistor 43$b$ is turned off and the transistor 43$d$ is turned on, with the result that the output $V_{out}$ of the voltage setting circuit 43 also decreases. Therefore, feedback is supplied to the control gate CG of the transistor 44 so as to decrease the current i. However, when the current i decreases, feedback is supplied to the dummy cell 42 so as to increase the current i. Therefore, the current i and the voltage $V_{out}$ are balanced under certain conditions. This means that when an EEPROM circuit is used, the control gate voltage of the MOS transistor 14 does not fluctuate due to fluctuation of the source voltage when information is read out.

When the MOS transistor 14 is not uniformly mass produced, the control gate voltage can be advantageously varied by adjusting the output 41$_{out}$ and by obtaining an optimum output $V_{out}$ so that the relationship between the current i and the output $4I_{out}$ varies.

The elements in the circuit 43 are determined so as to obtain a predetermined output $V_{out}$.

In the bias circuit shown in FIG. 4, a same load as that of the MOS transistor 14 shown in FIG. 1 is formed on the same chip by the same process, the mutual nonuniformity between the loads and the bias circuit is avoided and a voltage, which is supplied to the control gate CG, is generated. Further, in the dummy cell, the thin insulation film can be replaced with a thick insulation film in which the capacitance between FG and D is equivalent to the capacitance between CG and FG. However, in this case, an increase in the capacitance between FG and the substrate must be extremely limited and the thickness of a layer of $SiO_2$ is such that it cannot be removed.

Figure 5:
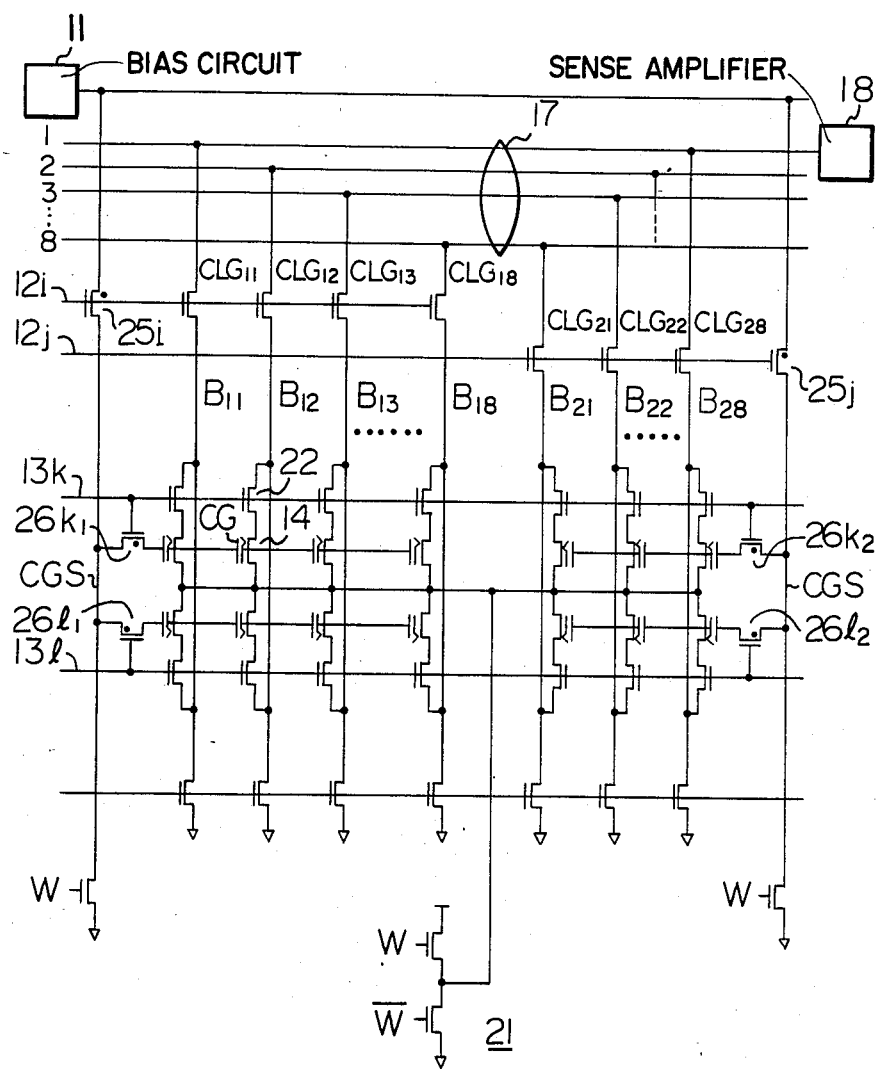
FIG. 5 is an embodiment according to the nonvolatile semiconductor memory circuit of the present invention.

FIG. 5 shows another embodiment in which high-speed operation can be obtained. In FIG. 5, only the portion relating to the present invention is shown, and the same elements as in FIG. 1 are represented by the same numerals and symbols. As is shown in FIG. 5, the column gate transistors 15i and 15j shown in FIG. 1 and the row control gate selection transistors 16$k_1$, 16K$_2$, 16$l_1$, 16$l_2$, etc. which are formed by enhancement-type MOS transistors are replaced with depletion-type MOS transistors 25i, 25j, 26$k_1$, 26K$_2$, 26$l_1$, 26$l_2$, etc. These depletion-type MOS transistors usually have a threshold voltage $V_{th}$ of about $-2$ V and are normally in the on state. Therefore, during an erase operation, the voltage $V_{pp}$ is supplied to the control gate of the MOS transistor without the voltage value being decreased. Further, when the MOS transistor 14 is placed in the non-selected state, the voltage at the control gate of the MOS transistor 14 is switched to a value about 2 V higher than the voltage potential "0" V at the gate of each of the transistors 25i, 25j, 26$k_1$, 26$k_2$, 26$l_1$ and 26$l_2$, with the difference in voltage being $|V_{th}|$. Therefore, when the MOS transistor 14 is selected, it is already in a somewhat charged state so that very little time is necessary to completely achieve the read-out state.

I claim:

1. A nonvolatile semiconductor memory circuit comprising:
    a plurality of bit lines;
    a plurality of word lines intersecting said plurality of bit lines;
    nonvolatile semiconductor memory cells, respectively, operatively connected at the intersections of said bit lines and said word lines, each of said nonvolatile semiconductor memory cells including a MOS transistor having a floating gate and a control gate;
    selection means, operatively connected to said word lines, for selecting one of said word lines;
    a plurality of sense amplifiers, operatively connected to selected ones of said bit lines, for detecting a current flowing through selected bit lines to said MOS transistors in selected ones of said nonvolatile semiconductor memory cells; and
    a bias circuit, operatively connected to said selection means, for supplying a bias voltage to said nonvolatile semiconductor memory cells connected to said word line selected by said selection means, said bias circuit comprising:
        a dummy cell having substantially the same construction as one of said nonvolatile semiconductor memory cells and including a dummy MOS transistor having a floating gate and a control gate; and
        a dummy sense amplifier having substantially the same construction as said sense amplifier, said dummy sense amplifier having an input operatively connected to said dummy cell for detecting a dummy current flowing through said dummy MOS transistor and generating an output voltage corresponding to said dummy current, said bias circuit outputting, as said bias voltage, a voltage proportional to said output voltage of said dummy sense amplifier, said bias voltage being fed back to said control gate of said dummy MOS transistor so that said dummy current is substantially constant.

2. A nonvolatile semiconductor circuit according to claim 1,
    further comprising a voltage setting circuit operatively connected to said dummy sense amplifier,
    wherein said dummy cell comprises:
        a first transistor having a floating gate, a control gate and a drain; and
        a second transistor operatively connected to said first transistor, and
    wherein said dummy sense amplifier comprises:
        a first series circuit comprising a first depletion-type transistor having a drain, a second depletion-type transistor, and a first enhancement-type transistor having a drain;
        a second series circuit comprising a second enhancement-type transistor having a drain connected to the drain of said first depletion-type transistor, a gate connected to a connection point of said first depletion-type transistor and said second depletion-type transistor, and a source connected to the gate of said first enhancement-type transistor and the drain of said second transistor in said dummy cell; and
        a third series circuit comprising a third depletion-type transistor and a third enhancement-type transistor having a gate connected to a connection point of said second depletion-type transistor and said first enhancement-type transistor,
    wherein said voltage setting circuit comprises:
        a fourth series circuit comprising a fourth depletion-type transistor and a fourth enhancement-type transistor having a gate connected to the connection point of said third depletion-type transistor and said third enhancement-type transistor; and
        a fifth series circuit comprising a fifth depletion-type transistor and a fifth enhancement-type transistor having a gate connected to the connection point of said fourth depletion-type transistor and said fourth enhancement-type transistor, and the connection point of said fifth depletion-type transistor and said fifth enhancement-type transistor is connected to the control gate of said first transistor in said dummy cell.

3. A nonvolatile semiconductor memory circuit operatively connected to receive a selected signal, and having sense amplifiers, comprising:
    a plurality of bit lines;
    a plurality of word lines intersecting said plurality of bit lines;
    a group of nonvolatile semiconductor memory cells, respectively, operatively connected at the intersections of said word lines and said bit lines, said nonvolatile semiconductor memory cells formed by MOS transistors, each of said memory cells including:
- a first MOS transistor having a floating gate and a control gate, and a second MOS transistor connected between a respective bit line and said first MOS transistor, said second MOS transistor being turned on and off upon receipt of the selected signal;
- a bias circuit, operatively connected to said control gates, for supplying a predetermined voltage to said control gates, said bias circuit comprising:
  - a dummy cell having substantially the same construction as one of the nonvolatile semiconductor memory cells and including a dummy MOS transistor having a floating gate and a control gate; and
  - a dummy sense amplifier having substantially the same construction as the sense amplifiers, and having an input operatively connected to said dummy cell for detecting a dummy current flowing through said dummy MOS transistor and generating an output voltage corresponding to said dummy current, said bias circuit outputting a voltage, proportional to said output voltage of said dummy sense amplifier, as said bias voltage, said bias voltage being fed back to said control gate of said dummy MOS transistor making said dummy current substantially constant;
- depletion-type MOS transistors, operatively connected between said control gates and said bias circuit, for selecting one of said word lines, the gates of said depletion-type MOS transistors being respectively, operatively connected to the gates of said second MOS transistors; and
- means, operatively connected to said depletion-type MOS transistors, for supplying a voltage of said depletion-type MOS transistors for determining whether a write or erase operation is to be performed in said memory cells connected to said selected one of said word lines.

4. A bias circuit for a nonvolatile semiconductor memory circuit, having nonvolatile semiconductor memory cells and sense amplifiers, comprising:
- a dummy cell having substantially the same construction as one of the nonvolatile semiconductor memory cells and including a dummy MOS transistor having a floating and a control gate; and
- a dummy sense amplifier having substantially the same construction as the sense amplifiers, and having an input operatively connected to said dummy cell, for detecting a dummy current flowing through said dummy MOS transistor and generating an output voltage corresponding to said dummy current, said bias circuit outputting a voltage, in proportion to said output voltage of said dummy sense amplifier, as said bias voltage, said bias voltage being fed back to said control gate of said dummy MOS transistor so that said dummy current is substantially constant.

5. A bias circuit according to claim 4, wherein said dummy cell comprises:
- a first transistor having a floating gate and a control gate and operatively connected to said voltage setting circuit; and
- a second transistor operatively connected in series with said first transistor.

6. A bias circuit according to claim 5, wherein said dummy sense amplifier comprises:
- a first depletion-type transistor;
- a second depletion-type transistor, operatively connected in series with said first depletion-type transistor, forming a first node therebetween;
- a first enhancement-type transistor operatively connected in series with said second depletion type transistor and operatively connected to said second transistor of said dummy cell;
- a second enhancement-type transistor, operatively connected to the first node between said first and second depletion-type transistors and said first enhancement-type transistor;
- a third depletion-type transistor; and
- a third enhancement-type transistor operatively connected in series with said third depletion-type transistor, forming a second node therebetween, and operatively connected to said second depletion-type transistor.

7. A bias circuit according to claim 6, further comprising an output terminal and a voltage setting circuit operatively connected to said dummy sense amplifier, wherein said voltage setting circuit comprises:
- a fourth enhancement-type transistor operatively connected to the second node between said third depletion-type and said third enhancement-type transistors;
- a fourth depletion-type transistor, operatively connected in series with said fourth enhancement-type transistor forming a third node therebetween;
- a fifth depletion-type transistor; and
- a fifth enhancement-type transistor, operatively connected in series with said fifth depletion-type transistor, forming a fourth node therebetween, and operatively connected to the third node, the fourth node operatively connected to said first transistor of said dummy cell and the output terminal.

* * * * *

UNITED STATES PATENT AND TRADEMARK OFFICE
CERTIFICATE OF CORRECTION

PATENT NO.   :   4,677,590

DATED        :   JUNE 30, 1987

INVENTOR(S)  :   HIDEKI ARAKAWA

It is certified that error appears in the above-identified patent and that said Letters Patent is hereby corrected as shown below:

Col. 1, line 22, after "via" insert --a--.

Col. 3, line 6, "18K" should be --13k--.

Signed and Sealed this

Eighth Day of December, 1987

Attest:

DONALD J. QUIGG

Attesting Officer

Commissioner of Patents and Trademarks